(12) United States Patent
Gombert et al.

(10) Patent No.: US 11,482,633 B2
(45) Date of Patent: Oct. 25, 2022

(54) VOLTAGE MATCHED MULTIJUNCTION SOLAR CELL

(71) Applicant: Saint-Augustin Canada Electric Inc., Saint-Augustin de Desmaures (CA)

(72) Inventors: Andreas Gombert, Freiburg (DE); Sascha Van Riesen, Freiburg (DE)

(73) Assignee: Saint-Augustin Canada Electric Inc., Saint-Augustin de Desmaures (CA)

(*) Notice: Subject to any disclaimer, the term of this patent is extended or adjusted under 35 U.S.C. 154(b) by 0 days.

(21) Appl. No.: 16/862,325

(22) Filed: Apr. 29, 2020

(65) Prior Publication Data

US 2020/0295210 A1  Sep. 17, 2020

Related U.S. Application Data

(62) Division of application No. 13/581,606, filed as application No. PCT/EP2011/001337 on Mar. 17, 2011, now Pat. No. 10,714,644.

(30) Foreign Application Priority Data

Apr. 9, 2010 (EP) .................... 10290190

(51) Int. Cl.
*H01L 31/052* (2014.01)
*H01L 31/076* (2012.01)

(52) U.S. Cl.
CPC .......... *H01L 31/052* (2013.01); *H01L 31/076* (2013.01); *Y02E 10/548* (2013.01)

(58) Field of Classification Search
None
See application file for complete search history.

(56) References Cited

U.S. PATENT DOCUMENTS

| | | | |
|---|---|---|---|
| 4,387,265 A | 6/1983 | Dalal | |
| 4,948,436 A | 8/1990 | Juergens | |
| 5,071,490 A | 12/1991 | Yokota et al. | |
| 5,118,361 A | 6/1992 | Fraas et al. | |
| 5,853,497 A | 12/1998 | Lillington et al. | |
| 2005/0155641 A1 | 7/2005 | Fafard | |
| 2008/0264478 A1 | 10/2008 | Ahn et al. | |
| 2009/0242018 A1 | 10/2009 | Ahn et al. | |

(Continued)

FOREIGN PATENT DOCUMENTS

| | | |
|---|---|---|
| CN | 101226967 A | 7/2008 |
| EP | 1962331 A2 | 8/2008 |

(Continued)

OTHER PUBLICATIONS

Chinese Office Action Received for CN Application No. 201180012598, dated Dec. 2, 2014, 16 pages.

(Continued)

*Primary Examiner* — Shannon M Gardner
(74) *Attorney, Agent, or Firm* — TraskBritt

(57) ABSTRACT

A voltage matched multijunction solar cell having first and second solar cell stacks that are electrically connected parallel to each other. The first solar cell stack is optimized for absorption of incoming solar light in a first wavelength range and the second solar cell stack is optimized for absorption of incoming solar light in a second wavelength range, wherein the first and the second wavelength range do not or at most only partially overlap each other.

6 Claims, 1 Drawing Sheet

(56) References Cited

U.S. PATENT DOCUMENTS

| | | | |
|---|---|---|---|
| 2010/0086775 | A1 | 4/2010 | Lairson et al. |
| 2011/0048501 | A1 | 3/2011 | Jaus et al. |
| 2016/0359079 | A1* | 12/2016 | Clevenger ........... H01L 31/1844 |

FOREIGN PATENT DOCUMENTS

| | | |
|---|---|---|
| JP | 56-148874 A | 11/1981 |
| JP | 60-160673 A | 8/1985 |
| WO | 2009/143931 A2 | 12/2009 |

OTHER PUBLICATIONS

Chinese Office Action Received for CN Application No. 201180012598, dated Jul. 22, 2015, 18 pages.
Chinese Office Action Received for CN Application No. 201180012598, dated Nov. 19, 2015, 18 pages.
Chinese Search Report for Chinese Application No. 2011800125980 dated Nov. 14, 2012, 2 pages.
Chinese Search Report for Chinese Application No. 2011800125980 dated Nov. 21, 2014, 10 pages.
European Office Action for European Application No. 10290190.7, dated Aug. 17, 2017, 3 pages.
European Search Report and Opinion for European Application No. 10290190.7 dated Aug. 26, 2017, 4 pages.
European Search Report and Search Opinion Received for EP Application No. 10290190, dated Sep. 6, 2010, 5 pages.
International Preliminary Report on Patentability, for International Application No. PCT/EP2011/001337, dated Oct. 9, 2012, 5 pages.
International Search Report, PCT/EP2011/001337, dated Mar. 13, 2012.
Jones et al., "Evolution of Multijunction Solar Cell Technology for Concentrating Photovoltaics," Jpn. J. Appl. Phys. 51 (2012) 10ND01, 5 pages.
Office Action received for European Patent Application No. 10290190, dated Apr. 12, 2018, 3 pages.
R.R. King et al., 40% efficient metamorphic Gain P/Gal nAs/Ge multijunction solar cells, 2007, Appl Physics Letts, 90, 183516.
Written Opinion of the International Search Authority for International Application No. PCT/EP2011/001337, dated Mar. 13, 2012, 4 pages.

* cited by examiner

VOLTAGE MATCHED MULTIJUNCTION SOLAR CELL

CROSS-REFERENCE TO RELATED APPLICATIONS

This application is a divisional of U.S. patent application Ser. No. 13/581,606, filed Aug. 28, 2012, now U.S. Pat. No. 10,714,644, issued Jul. 14, 2020, which is a national phase entry under 35 U.S.C. § 371 of International Patent Application PCT/EP2011/001337, filed Mar. 17, 2011, designating the United States of America and published in English as International Patent Publication WO 2011/124321 A2 on Oct. 13, 2011, which claims the benefit under Article 8 of the Patent Cooperation Treaty and under 35 U.S.C. § 119(e) to European Patent Application Serial No. 10290190.7, filed Apr. 9, 2010, the disclosure of each of which is hereby incorporated herein in its entirety by this reference.

TECHNICAL FIELD

The present disclosure relates to a solar multijunction cell and, in particular, to a solar multijunction cell comprising a first solar cell stack and a second solar cell stack sandwiching a conduction layer.

BACKGROUND

Photovoltaic or solar cells are designed for converting solar radiation to electrical current. In concentrator solar photovoltaic applications, the incoming sunlight is optically concentrated before it is directed to solar cells. For example, the incoming sunlight is received by a primary mirror that reflects the received radiation toward a secondary mirror that, in turn, reflects the radiation toward a solar cell, which converts the concentrated radiation to electrical current by the generation of electron-hole pairs in III-V semiconductor or single crystal silicon, for example. Concentrator photovoltaics may, alternatively or additionally, comprise Fresnel lens optics for the concentration of the incoming solar radiation.

Since different semiconductor material compositions show optimal absorption for different wavelengths of the incoming solar radiation, multijunction cells have been proposed that comprise, for example, three cells showing optimal absorption in different wavelength ranges. The individual cells of the multijunction cell are electrically connected in series. Consequently, the particular cell having the lowest rate of generation of free charge carriers limits the overall power generation, i.e., the gained total current. This current matching is usually designed for the standard AM 1.5d ASTM 173-3 spectrum. However, the actual spectrum of the incoming solar light is time-dependent on scales from minutes or hours to months. In particular, the spectrum changes with seasons, day-time and weather conditions. Thus, the current matching results in significant performance losses due to the variability of the incoming solar light.

Thus, despite the recent engineering progress, there is still a need for a solar cell configuration that is only hardly affected by the temporally varying spectrum of incoming light.

BRIEF SUMMARY

The present disclosure addresses the above-mentioned need and, accordingly, provides a solar cell, in particular, a voltage matched multijunction solar cell, comprising: a first solar cell stack and at least a second solar cell stack, wherein the solar cell stacks are electrically connected parallel to each other.

Each solar cell stack may be a single junction or a series connected multijunction in itself. In the case of multijunction solar cell stacks, the individual cell stacks are current matched.

In particular, the first solar cell stack may be optimized (with respect to the valence-conduction band gap(s)) for absorption of incoming solar light in a first wavelength range and the second solar cell stack may be optimized for absorption of incoming solar light in a second wavelength range, wherein the first and the second wavelength ranges at most partially overlap each other. For example, the first wavelength range is given by 300 nm to 750 nm (within a tolerance of some ±70 nm) and the second wavelength range extends from 750 nm to larger wavelengths in the infrared regime.

Different from multijunction cells of the art, according to the present disclosure, different stacks of solar cells are electrically connected parallel to each other and are integrated on a single semiconductor chip. Thereby, the above-mentioned problem related to current matching is alleviated in an economic way. In particular, temporal changes in the spectrum of the incoming solar light are not severely affecting the overall performance of the multi solar cell. The insensitiveness with respect to the spectrum of the incoming light can be further improved by providing the two solar cell stacks with the same or a similar open-circuit voltage. By a "similar open-circuit voltage," a deviation in the range of less than 5%, particularly, less than 3% and more particularly, less than 1% is meant. Furthermore, the two solar cell stacks may exhibit opposite (p-n) polarity in order to reduce the wiring complexity.

According to an embodiment, the multi solar cell of the above examples comprises a conduction layer that is arranged between the first and the second solar cell stack and has an integrated transparency of more than 80% over the wavelength range that is utilized by solar cell stack 3. The conduction layer may comprise or consist of an n doped semiconductor material. The conduction layer contacts the first and the second solar cell stack and facilitates lateral current transport.

Furthermore, the inventive solar cell stack may comprise a cooling substrate, in particular, a thermally and electrically conductive cooling substrate, and a bonding pad for bonding the second solar cell stack to the cooling substrate. The bonding pad and/or the cooling substrate may comprise or consist of an aluminum alloy, in particular, of a 99.5% aluminum alloy. Thereby, not only sufficiently high thermal and electrical conductivity are guaranteed, but also thermal stresses between the bonding pad and the cooling substrate are largely avoided by the choice of the same material.

According to an example, the first and the second solar cell stack are electrically connected in parallel by a metal layer formed on an insulator. According to an alternative example, the first and the second solar cell stack are electrically connected in parallel after die attach by a wire connecting a p contact of the first solar cell stack and a p contact of the electrically conductive cooling substrate on which a concentrator solar cell is mounted as known in the art.

The first solar cell stack may comprise or consist of a GaInP cell and the second solar cell stack may comprise or consist of a GaInAs top cell and a Ge bottom cell. Conventionally used compound semiconductor materials like GaInP, InGaAs and Ge may, thus, be employed in the present disclosure that allow for a good coverage of the optical spectrum of the incoming solar light. It should be noted that voltage matching of the first solar cell stack and the second solar cell stack, i.e., in this example, of the GaInP top cell and the GaInAs/Ge tandem cell, may be optimized by an appropriate choice of the particular stoichiometric relations of the semiconductor materials used in the first and second solar cell stacks, or by the choice of different III-V compound semiconductors that better suit the voltage match and efficient use of the corresponding wavelength ranges.

The present disclosure also provided a solar cell apparatus comprising a concentrator optics and a voltage matched multijunction solar cell according to one of the above-described examples.

The above-mentioned need is also addressed by a method for the manufacture of a (voltage matched multijunction) solar cell, comprising the steps of providing a first solar cell stack; providing a second solar cell stack; attaching the first solar cell stack on a first surface of a transparent conduction layer, in particular, a semiconductor layer; attaching the second solar cell stack on a second surface of the conduction layer opposite to the first surface; and electrically connecting the first and the second solar cell stack parallel to each other.

Electrically connecting the first and the second solar cell stack parallel to each other may either comprise forming an insulator layer on edges or side faces of the first solar cell stack and the second solar cell stack and the conduction layer; and forming on the insulator layer, in particular, by vapor deposition, a metal layer connecting a contact (not already connected by the conduction layer) of the first solar cell stack and a contact of the second solar cell stack; or forming a temporary insulation layer on edges or side faces of the first solar cell stack and the second solar cell stack and the conduction layer; and forming on the temporary insulator layer, in particular, by vapor deposition, a metal layer connecting a contact (not already connected by the conduction layer) of the first solar cell stack and a contact of the second solar cell stack; and removing the insulation layer afterwards, leaving a bridge interconnect; or connecting a contact of the first solar cell stack and a contact of the second solar cell stack that is electrically connected to the cooling substrate after die-attach by a wire, for example, a thin gold or aluminum wire.

Thus, the parallel connection is either established during the manufacture of the stacked configuration comprising the first and the second solar cell stacks as well as the conduction layer or after attachment of it (the cell chip) to the cooling substrate.

BRIEF DESCRIPTION OF THE DRAWINGS

Additional features and advantages of the present disclosure will be described with reference to the drawings. In the description, reference is made to the accompanying figures that are meant to illustrate preferred embodiments of the present disclosure. It is understood that such embodiments do not represent the full scope of the present disclosure.

DETAILED DESCRIPTION

Figure 1:
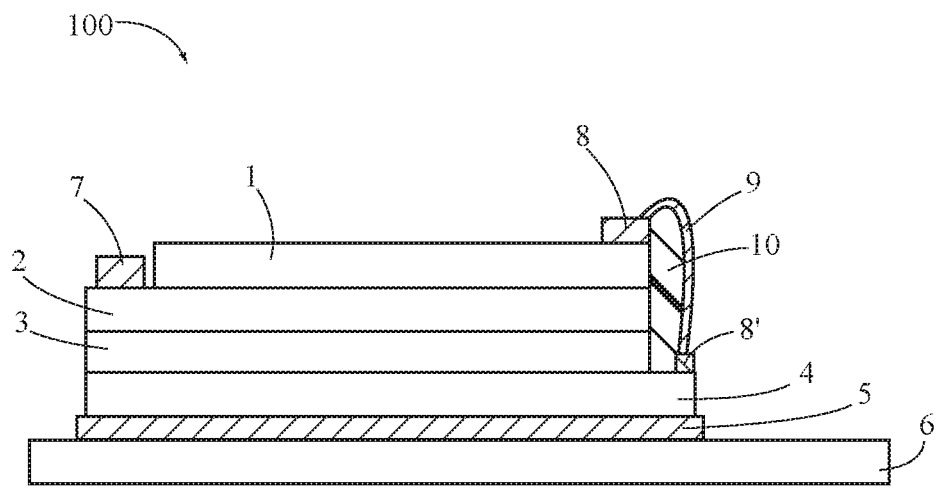
FIG. 1 illustrates a voltage matched multijunction solar cell according to an example of the present disclosure. The voltage matched multijunction solar cell comprises two stacks of solar cells and a conduction layer arranged between the two stacks.

As shown in FIG. 1 according to an exemplary realization of the present disclosure, a voltage matched multijunction solar cell 100 comprises a first solar cell stack 1 provided on a conduction layer 2 provided on a second solar cell stack 3. Each of the first and the second solar cell stacks 1 and 3 comprise one or more solar cells. The solar cells of the first solar cell stack 1 are electrically connected in series and the solar cells of the second solar cell stack 3 are electrically connected in series. In each of the solar cell stacks 1 and 3, current matching is performed. For example, the first solar cell stack 1 is adapted for absorption of photons of incoming solar light in the wavelength range of 300 nm to 750 nm (within a tolerance of some ±70 nm). The second solar cell stack 3 is adapted for optimal absorption at larger wavelengths (infrared regime).

According to the present disclosure, the first solar cell stack 1 is electrically connected parallel to the second solar cell stack 3. Relative intensity shifts between the wavelength ranges suitable for the first and the second solar cell stacks 1 and 3, therefore, do not significantly affect the performance of the voltage matched multijunction solar cell 100. In order to achieve a high conversion efficiency, both solar cell stacks 1 and 3 advantageously have the same or a similar open-circuit voltage. Moreover, in order to save the complexity and expensiveness of the wiring, the first solar cell stack 1 and the second solar cell stack 3 show opposite (p-n) polarities and are connected by the conduction layer 2.

The conduction layer 2 can be made of or comprise a doped semiconductor material. Due to the higher mobility of electrons compared to holes, an n doped semiconductor, for instance, an n++ doped semiconductor, may be provided for the conduction layer 2.

According to an alternative embodiment, an embedded grid is provided rather than the conduction layer 2. The conduction layer 2 shows a higher integrated transparency than 80% over the wavelength range that is converted by the second solar cell stack 3.

If an n doped semiconductor is provided for the conduction layer 2, the first solar cell stack 1 shows a p on n polarity, whereas, in this case, the second solar cell stack 3 shows an n on p polarity. Thereby, the base of the lowermost cell of the first solar cell stack 1, as well as the emitter of the uppermost cell of the second solar cell stack 3, contribute to the lateral current in the conduction layer 2.

The second solar cell stack 3 comprises a lower cell-substrate 4 that either has a very good electrical conductivity or contains a contact layer that is used for the die-attach to the cooling substrate 6, for example, using solder or electrically conductive adhesive 5. The cooling substrate 6 can be provided in the form of a thermally and electrically conductive cooling substrate 6 and functions as a plus pole of the voltage matched multijunction solar cell. It is preferred that the bonding pad 5 and the cooling substrate 6 are made of the same material. According to an example, this material is an aluminum alloy, in particular, a 99.5% aluminum alloy. Thermal stresses between the bonding pad 5 and the cooling substrate 6 are largely avoided by the choice of the same material.

In principle, the cooling substrate 6 may consist of a plane metal and shall provide thermal heat spreading and may also serve as an electric conductor. The dimensions and, particularly, the thickness of the plane metal (as well as the thickness of the bonding pad 5) can be selected in accordance with the desired cooling performance.

An n contact 7 is provided on the lateral conduction layer 2. As already mentioned, the first and second solar cell stacks 1 and 3 are electrically connected parallel to each other. In the example shown in FIG. 1, the parallel connection is realized by connecting the p contacts 8 and 8' of the first solar cell stack 1 and the second solar cell stack 3, respectively, by means of a metal connection 9 formed on an insulator material 10. For example, the insulator material 10 may be formed of polyimide and the metal connection 9 is formed by vapor deposition. Alternatively, a temporary insulator could be used, that is, removed after forming the metal connection, leaving an interconnection bridge. Thus, the parallel connection is established during the manufacture of the configuration comprising the two solar cell stacks 1 and 3 sandwiching the conduction layer 2.

Figure 2:
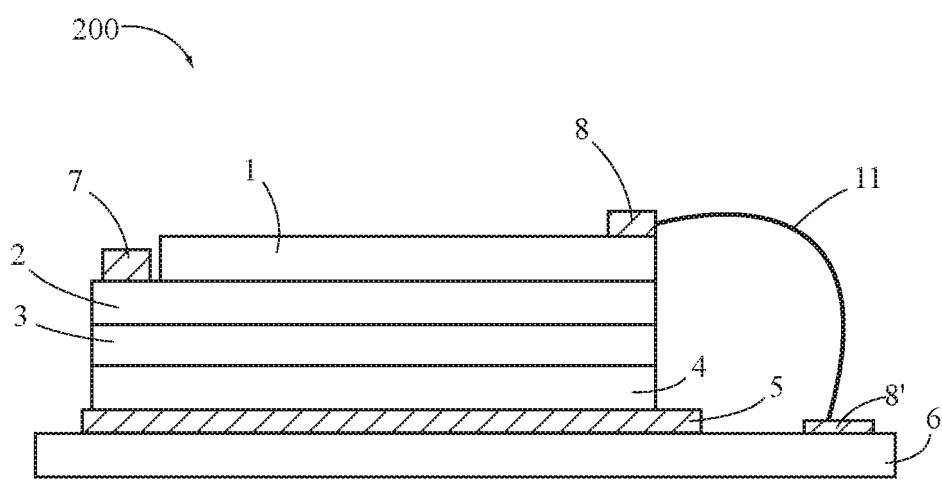
FIG. 2 illustrates a voltage matched multijunction solar cell according to another example of the present disclosure. The voltage matched multijunction solar cell comprises two stacks of solar cells and a conduction layer arranged between the two stacks.

An alternative example of the inventive voltage matched multijunction solar cell is shown in FIG. 2. This exemplary voltage matched multijunction solar cell 200 also comprises the solar cell stacks 1 and 3, the conduction layer 2 and the bonding pad 5, as well as the cooling substrate 6 shown in FIG. 1. However, the electric parallel connection of the first solar cell stack 1 and the second solar cell stack 3 is realized differently. Rather than by depositing a metal layer on an insulator wherein the metal layer connects the p pole of the first and second solar cell stacks 1 and 3, according to the example shown in FIG. 2, wire bonding between the p contact of the first solar cell stack 1 and the p contact provided on the cooling substrate 6 establishes the parallel connection. In this case, connecting the first solar cell stack 1 and the second solar cell stack 3 in parallel is performed after mounting cell chips to the electrically conductive cooling substrate 6 by means of a thin wire 11. The thin wire 11 may be made of gold or aluminum.

Whereas, in FIG. 1, a first p on n cell stack 1 and a second n on p cell stack 3 are shown, according to another example, the first solar cell stack 1 may be an n on p cell stack and the second solar cell stack 3 may be a p on n cell stack. In this case, the lateral conduction layer 2 may be an embedded grid. Moreover, in this case, the insulator material 10 is removed after the metal connection 9 has been formed, leaving a bridge interconnect formed by metal connection 9. In this configuration, the better conductivity of the n-doped semiconductor can be employed for the emitter layer of the uppermost solar cell of p on n cell stack 1.

In both the example of a voltage matched multijunction solar cell 100 shown in FIG. 1 and the example of a voltage matched multijunction solar cell 200 shown in FIG. 2, the first solar cell stack 1 may comprise or consist of a GaInP cell and the second solar cell stack 3 may comprise or consist of a GaInAs top cell and a Ge bottom cell. For the voltage matched multijunction solar cells 100 and 200, a metamorphic $Ga_{0.35}In_{0.65}P/Ga_{0.83}In_{0.17}As/Ge$ material may be chosen, for example. Voltage matching of the GaInP top cell and the GaInAs/Ge double cell may be optimized by an appropriate choice of the particular stoichiometric relations.

All previously discussed embodiments are not intended as limitations but serve as examples illustrating features and advantages of the present disclosure. It is to be understood that some or all of the above-described features can also be combined in different ways.

What is claimed is:

1. A method for the manufacture of a solar cell, which comprises:
    providing a first solar cell stack;
    providing a second solar cell stack;
    attaching the first solar cell stack on a first surface of a conduction layer;
    attaching the second solar cell stack on a second surface of the conduction layer opposite to the first surface; and
    electrically connecting the first and the second solar cell stacks parallel to each other; and
    wherein electrically connecting the first and the second solar cell stacks parallel to each other comprises:
        forming an insulation layer on edges or side faces of the first solar cell stack and the second solar cell stack and the conduction layer; and
        forming on the insulator layer, a metal layer connecting a contact, not already connected by the conduction layer, of the first solar cell stack and a contact of the second solar cell stack; and
        removing the insulation layer afterwards, leaving a bridge interconnect.

2. The method of claim 1, wherein the conduction layer comprises a semiconductor layer.

3. The method of claim 1, wherein electrically connecting the first and the second solar cell stacks parallel to each other comprises:
    forming an insulator layer on edges or side faces of the first solar cell stack and the second solar cell stack and the conduction layer; and
    forming on the insulator layer, a metal layer connecting a contact, not already connected by the conduction layer, of the first solar cell stack and a contact of the second solar cell stack.

4. The method of claim 3, wherein the metal layer is formed by vapor deposition.

5. The method of claim 1, wherein electrically connecting the first and the second solar cell stacks parallel to each other comprises connecting a contact of the first solar cell stack and a contact of the second solar cell stack that is electrically connected to a cooling substrate by a conductive wire.

6. The method of claim 1, wherein electrically connecting the first and the second solar cell stacks parallel to each other comprises connecting a front contact of the first solar cell stack and a backside contact of another solar cell stack that is connected to a cooling substrate by a conductive wire.

* * * * *